(12) United States Patent
Li et al.

(10) Patent No.: US 10,796,656 B1
(45) Date of Patent: Oct. 6, 2020

(54) GOA CIRCUIT

(71) Applicant: Wuhan China Star Optoelectronics Technology Co., Ltd., Wuhan (CN)

(72) Inventors: Yafeng Li, Wuhan (CN); Jinfang Wu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 191 days.

(21) Appl. No.: 16/308,813

(22) PCT Filed: Sep. 27, 2018

(86) PCT No.: PCT/CN2018/108054
§ 371 (c)(1),
(2) Date: Dec. 10, 2018

(87) PCT Pub. No.: WO2019/227807
PCT Pub. Date: Dec. 5, 2019

(30) Foreign Application Priority Data

May 30, 2018 (CN) .......................... 2018 1 0539839

(51) Int. Cl.
*G09G 3/36* (2006.01)
(52) U.S. Cl.
CPC ......... *G09G 3/3677* (2013.01); *G09G 3/3696* (2013.01); *G09G 2310/08* (2013.01)

(58) Field of Classification Search
CPC . G09G 3/3677; G09G 3/3696; G09G 2310/08
See application file for complete search history.

(56) References Cited

U.S. PATENT DOCUMENTS

| | | | |
|---|---|---|---|
| 9,728,147 B2* | 8/2017 | Xiao | G11C 19/28 |
| 9,779,682 B2* | 10/2017 | Dai | G09G 3/3677 |
| 9,786,239 B2* | 10/2017 | Cao | G02F 1/136286 |
| 9,933,889 B2* | 4/2018 | Xiao | G09G 3/36 |
| 2016/0300623 A1* | 10/2016 | Yang | G11C 19/28 |
| 2016/0343323 A1* | 11/2016 | Xiao | H01L 27/124 |
| 2017/0047031 A1* | 2/2017 | Cao | G11C 19/28 |
| 2017/0124975 A1* | 5/2017 | Xiao | G09G 3/3677 |
| 2017/0148403 A1* | 5/2017 | Dai | G09G 3/3677 |
| 2018/0047751 A1* | 2/2018 | Xiao | G09G 3/3659 |
| 2018/0174545 A1* | 6/2018 | Li | G09G 3/3648 |
| 2018/0218701 A1* | 8/2018 | Yi | G09G 3/3677 |

* cited by examiner

Primary Examiner — Peter D McLoone
(74) Attorney, Agent, or Firm — Leong C. Lei

(57) ABSTRACT

The invention provides a GOA circuit. The first node control module of the GOA circuit provided by the invention comprises a tenth TFT, an eleventh TFT and a twelfth TFT of N-type TFTs, when the voltage of the first node is high, the gate-to-source voltage difference of the twelfth TFT is the threshold voltage thereof, so that the drain-source voltage difference of the eleventh TFT is also the threshold voltage of the twelfth TFT, thereby making the resistance between the drain of the tenth TFT and the first node is extremely large, which can avoid the impact of leakage current generated by the tenth TFT on the voltage of the first node when the noise and coupling in the second node occurs, and to ensure the normal output of the scan signal.

10 Claims, 5 Drawing Sheets

GOA CIRCUIT

BACKGROUND OF THE INVENTION

1. Field of the Invention

The present invention relates to the field of display, and in particular to a gate driver on array (GOA) circuit.

2. The Related Arts

Liquid crystal display (LCD) provides many advantages, such as, thinness, power saving, and no radiation, and has been widely used, such as, LCD TV, mobile phone, personal digital assistant (PDA), digital camera, computer screen or laptop screen.

Most of the LCDs on the market are backlight type LCD, which comprises an LCD panel and a backlight module. Generally, an LCD panel comprises a color filter (CF) substrate, a thin film transistor (TFT) array substrate, a liquid crystal (LC) layer sandwiched between the CF substrate and the TFT array substrate, and a sealant. The operating principle of the LCD panel is to place LC molecules in two parallel glass substrates, with many vertical and horizontal thin wires between the two glass substrates, and the LC molecules are controlled to change direction by energizing the wires or not to refract the light of the backlight module to produce an image.

In the active LCD, each pixel is electrically connected to a thin film transistor (TFT), the gate of the TFT is connected to a horizontal scan line, and the source is connected to a vertical data line, and the drain is connected to a pixel electrode. Applying sufficient voltage on the horizontal scan line will turn on all TFTs electrically connected to the horizontal scan line, so that the signal voltage on the data line can be written into the pixel, and the transmittance of different liquid crystals can be controlled to control the color and brightness. At present, the driving of the horizontal scan line of the active LCD panel is mainly completed by an external integrated circuit (IC), and the external IC can control the stage-wise charging and discharging of the horizontal scan lines.

The gate driver on array (GOA) technology is an array substrate row-driving technology, which is a driving method wherein a gate driving circuit is fabricated on a TFT array substrate by using an array process of LCD panel to realize a gate row-by-row scanning. The GOA technology can reduce the bonding process of external ICs, increase the productivity and reduce the product cost, and make the LCD panel more suitable for narrow-frame or borderless display products.

The known GOA circuit comprises a plurality of stages of GOA units, and each stage of the GOA unit comprises a forward/backward scan control module, an output module, and a pull-down module. The forward/backward scan control module controls the voltage of the first node according to the scan signal of the (n−2)th GOA unit, the scan signal of the (n+2)th GOA unit, the forward scan control signal, and the backward scan control signal. The output module outputs a scan signal according to the voltage of the first node and the first clock signal. The pull-down module pulls down the voltage of the scan signal according to the second clock signal and maintains the voltage of the first node at a low voltage. A thin film transistor (TFT) is disposed in the pull-down module, the gate of the TFT is electrically connected to the second node, the source is connected to the constant voltage low voltage, the drain is electrically connected to the first node. The second node is a node used for the pulling down the voltage of the scan signal. Ideally, when the first node is at a high voltage, the voltage of the second node is low. At this point, the TFT is turned off, and the constant voltage low voltage does not affect the voltage of the first node. However, in actual operation, when the first node is in the high voltage phase, the drain-source voltage difference of the TFT is the difference between the high voltage of the first node and the constant voltage low voltage. As the high voltage of the first node is generally close to the constant voltage high voltage, at this time, the drain-source voltage difference of the TFT is close to the difference between the constant high voltage and the constant low voltage. Once the noise and coupling occur at the second node, the TFT is prone to leakage, so that the constant low voltage pulls the voltage of the first node down incorrectly, and the output of the normal scan signal cannot be guaranteed, which affects the display quality.

SUMMARY OF THE INVENTION

The object of the present invention is to provide a GOA circuit, able to avoid leakage current generated by the TFT due to noise and coupling at the second node, and to ensure the normal output of the scan signal.

To achieve the above object, the present invention provides a GOA circuit, comprising: a plurality of cascaded GOA units, each GOA unit further comprising: a forward/backward scan control module, an output module, a second node control module, a first node control module, and an output terminal control module;

for positive integers N and M, in the N-th GOA unit:

the forward/backward scan control module being configured to control a voltage of a first node according to a scan signal of the (N−2)th GOA unit, a scan signal of the (N+2)th GOA unit, a forward scan control signal, and a backward scan control signal;

the output module being configured to output a scan signal according to an M-th clock signal and the voltage of the first node;

the second node control module being configured to control a voltage of a second node according to an (M+2)th clock signal, the voltage of the first node, and a constant voltage low voltage;

the output terminal control module being configured to pull down the voltage of the scan signal according to the voltage of the second node and the constant low voltage;

the first node control module comprising a tenth thin film transistor (TFT), an eleventh TFT, and a twelfth TFT; the tenth TFT having a gate electrically connected to the second node, a source connected to the constant low voltage, a drain electrically connected to a source of the twelfth TFT; the eleventh TFT having a gate electrically connected to the second node, and a drain electrically connected to the first node, and a source electrically connected to the source of the twelfth TFT; the twelfth TFT having a gate electrically connected to the first node, and a drain connected to a constant high voltage; the tenth TFT, the eleventh TFT and the twelfth TFT being N-type TFTs.

The forward/backward scan control module comprises a first TFT and a second TFT, and the first TFT has a gate connected to the scan signal of the (N−2)th GOA unit, a source connected to the forward scan control signal, a drain electrically connected to the first node, and the second TFT has a gate connected to the scan signal of the (N+2)th GOA unit, a source connected to the backward scan control signal, and a drain electrically connected to the first node.

The output module comprises a third TFT, a ninth TFT and a first capacitor; the ninth TFT has a gate connected to the constant high voltage, a source electrically connected to the first node and a drain electrically connected to a gate of the third TFT; the third TFT has a source connected to the M-th clock signal, and a drain outputting the scan signal; the first capacitor has two ends electrically connected respectively to the gate and the drain of the third TFT.

The second node control module comprises a fifth TFT and a sixth TFT; the fifth TFT has a gate electrically connected to the first node, a source connected to the constant low voltage, and a drain electrically connected to the second node; the sixth TFT has a gate and a source connected to the (M+2)th clock signal, and a drain electrically connected to the second node.

The output control module comprises a fourth TFT; the fourth TFT has a gate electrically connected to the second node, a source connected to the constant low voltage, and a drain electrically connected to the drain of the third TFT.

Each GOA unit further comprises: a reset module, a bootstrap capacitor module, and a global control module; the reset module comprises a seventh TFT; and the seventh TFT has a gate and a source connected a reset signal, a drain electrically connected to the second node; the bootstrap capacitor module comprises a second capacitor, the second capacitor has one end electrically connected to the second node, and the other end connected to the constant low voltage; the global control module comprises an eighth TFT, the eighth TFT has a gate connected to a global control signal, a source connected to the constant low voltage, and a drain electrically connected to the drain of the third TFT.

In forward scanning, the forward scan control signal is high and the backward scan control signal is low.

In backward scanning, the forward scan control signal is low and the backward scan control signal is high.

The GOA circuit comprises four clock signals: a first clock signal, a second clock signal, a third clock signal, and a fourth clock signal; when the M-th clock signal is a third clock signal, the (M+2)th clock signal is the first clock signal; when the M-th clock signal is the fourth clock signal, the (M+2)th clock signal is the second clock signal.

The first clock signal, the second clock signal, the third clock signal, and the fourth clock signal have the same pulse period, and a falling edge of the previous clock signal is generated simultaneously with a rising edge of the next clock signal.

The present invention provides the following advantages: the first node control module of the GOA circuit provided by the present invention comprises a tenth TFT, an eleventh TFT and a twelfth TFT of N-type TFTs, when the voltage of the first node is high, the gate-to-source voltage difference of the twelfth TFT is the threshold voltage thereof, so that the drain-source voltage difference of the eleventh TFT is also the threshold voltage of the twelfth TFT, thereby making the resistance between the drain of the tenth TFT and the first node is extremely large, which can avoid the impact of leakage current generated by the tenth TFT on the voltage of the first node when the noise and coupling in the second node occurs, and to ensure the normal output of the scan signal.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
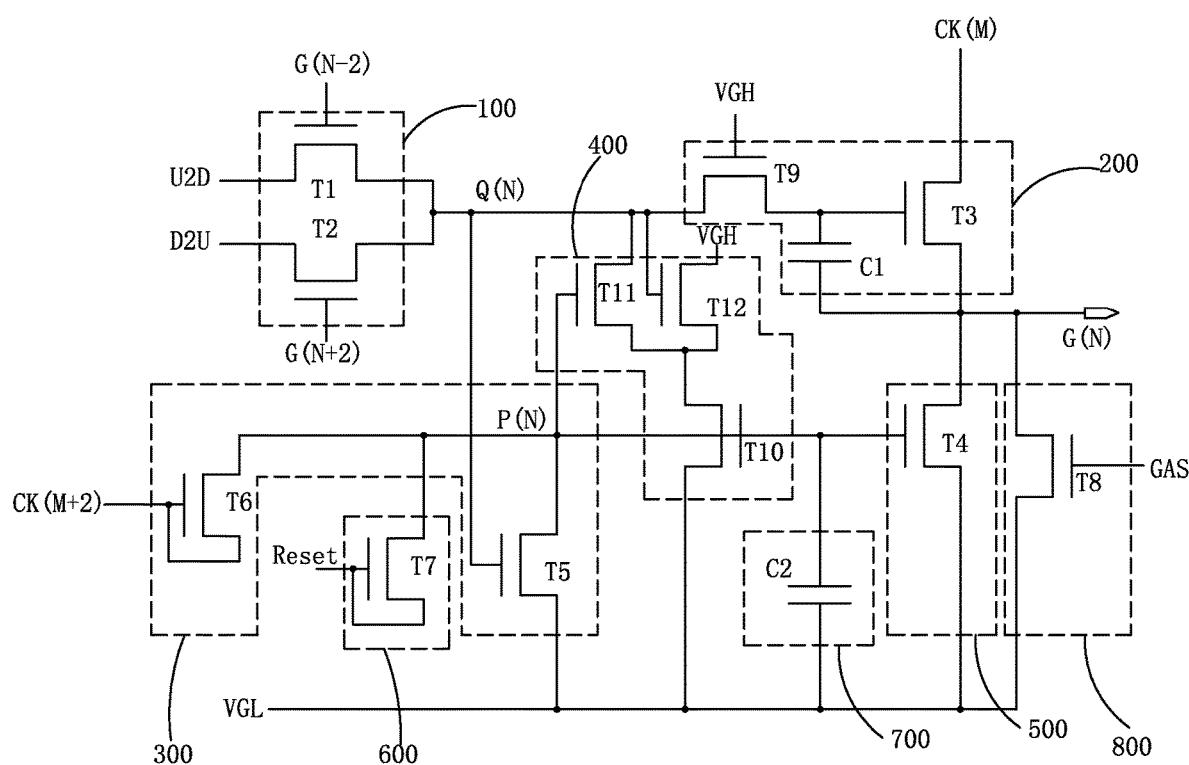
FIG. 1 is a schematic view showing the GOA circuit of the present invention.

To further explain the technical means and effect of the present invention, the following refers to embodiments and drawings for detailed description.

Refer to FIG. 1 to FIG. 5. The GOA circuit of the present invention provides comprises: a plurality of cascaded GOA units, each GOA unit further comprising: a forward/backward scan control module 100, an output module 200, a second node control module 300, a first node control module 400, and an output terminal control module 500.

Referring to FIG. 1, for positive integers N and M, N≥3, in the N-th GOA unit:

The forward/backward scan control module 100 is configured to control a voltage of a first node Q(N) according to a scan signal G(N−2) of the (N−2)th GOA unit, a scan signal G(N+2) of the (N+2)th GOA unit, a forward scan control signal U2D, and a backward scan control signal D2U.

The output module 200 is configured to output a scan signal G(N) according to an M-th clock signal CK(M) and the voltage of the first node Q(N).

The second node control module 300 is configured to control a voltage of a second node P(N) according to an (M+2)th clock signal CK(M+2), the voltage of the first node Q(N), and a constant voltage low voltage VGL.

The output terminal control module 500 is configured to pull down the voltage of the scan signal G(N) according to the voltage of the second node P(N) and the constant low voltage VGL. The first node control module 400 comprises a tenth TFT T10, an eleventh TFT T11, and a twelfth TFT T12; the tenth TFT T10 has a gate electrically connected to the second node P(N), a source connected to the constant low voltage VGL, a drain electrically connected to a source of the twelfth TFT T12; the eleventh TFT T11 has a gate electrically connected to the second node P(N), and a drain electrically connected to the first node Q(N), and a source electrically connected to the source of the twelfth TFT T12; the twelfth TFT T12 has a gate electrically connected to the first node Q(N), and a drain connected to a constant high voltage VGH; the tenth TFT T10, the eleventh TFT T11 and the twelfth TFT T12 are N-type TFTs.

Specifically, referring to FIG. 1, in a preferred embodiment of the present invention:

The forward/backward scan control module 100 comprises a first TFT T1 and a second TFT T2, and the first TFT T1 has a gate connected to the scan signal G(N−2) of the (N−2)th GOA unit, a source connected to the forward scan control signal U2D, a drain electrically connected to the first node Q(N), and the second TFT T2 has a gate connected to the scan signal G(N+2) of the (N+2)th GOA unit, a source connected to the backward scan control signal D2U, and a drain electrically connected to the first node Q(N).

The output module 200 comprises a third TFT T3, a ninth TFT T9 and a first capacitor C1; the ninth TFT T9 has a gate connected to the constant high voltage VGH, a source electrically connected to the first node Q(N) and a drain electrically connected to a gate of the third TFT T3; the third TFT T3 has a source connected to the M-th clock signal CK(M), and a drain outputting the scan signal G(N); the first capacitor C1 has two ends electrically connected respectively to the gate and the drain of the third TFT T3.

The second node control module 300 comprises a fifth TFT T5 and a sixth TFT T6; the fifth TFT T5 has a gate electrically connected to the first node Q(N), a source connected to the constant low voltage VGL, and a drain electrically connected to the second node P(N); the sixth TFT T6 has a gate and a source connected to the (M+2)th clock signal CK(M+2), and a drain electrically connected to the second node P(N).

The output control module 500 comprises a fourth TFT T4; the fourth TFT T4 has a gate electrically connected to the second node P(N), a source connected to the constant low voltage VGL, and a drain electrically connected to the drain of the third TFT T3.

Specifically, referring to FIG. 1, each GOA unit further comprises: a reset module 600, a bootstrap capacitor module 700, and a global control module 800; the reset module 600 comprises a seventh TFT T7; and the seventh TFT T7 has a gate and a source connected a reset signal Reset, a drain electrically connected to the second node P(N); the bootstrap capacitor module 700 comprises a second capacitor C2, the second capacitor C2 has one end electrically connected to the second node P(N), and the other end connected to the constant low voltage VGL; the global control module 800 comprises an eighth TFT T8, the eighth TFT T8 has a gate connected to a global control signal GAS, a source connected to the constant low voltage VGL, and a drain electrically connected to the drain of the third TFT T4. The provision of the eighth TFT T8 enables the GOA circuit of the present invention can use global control signal GAS to control all the eighth TFTs T8 of all the GOA units to run on in the touch sensing phase when applied to a touch panel to pull down the output voltage of the output terminals of the GOA units to facilitate the touch function.

Specifically, the first TFT T1, the second TFT T2, the third TFT T3, the fourth TFT T4, the fifth TFT T5, the sixth TFT T6, the seventh TFT T7, the eighth TFT T8 and the ninth TFT T9 are all N-type TFTs.

Preferably, the first TFT T1, the second TFT T2, the third TFT T3, the fourth TFT T4, the fifth TFT T5, the sixth TFT T6, the seventh TFT T7, the eighth TFT T8, the ninth TFT T9, the tenth TFT T10, the eleventh TFT T11 and the twelfth TFT T12 are all low temperature polysilicon (LTPS) TFTs.

Figure 2:
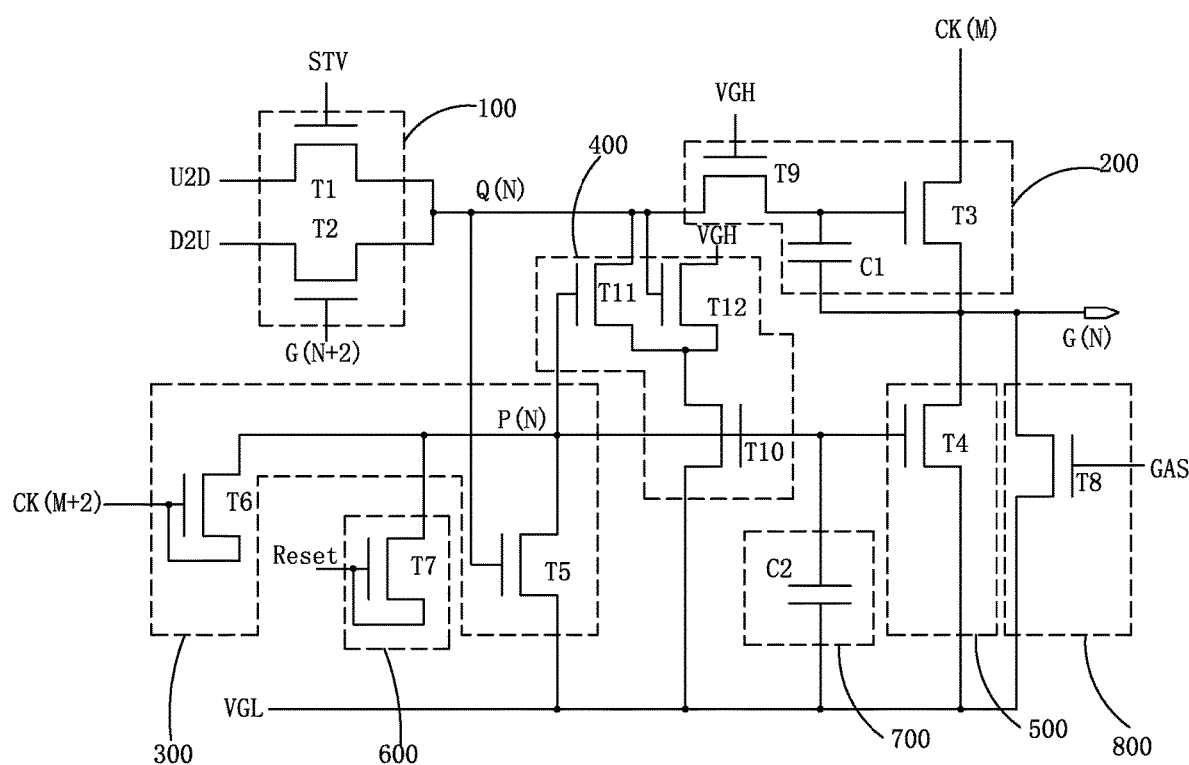
FIG. 2 is a schematic view showing the circuit of the first GOA unit and the second GOA unit of the GOA circuit of the present invention.
Figure 3:
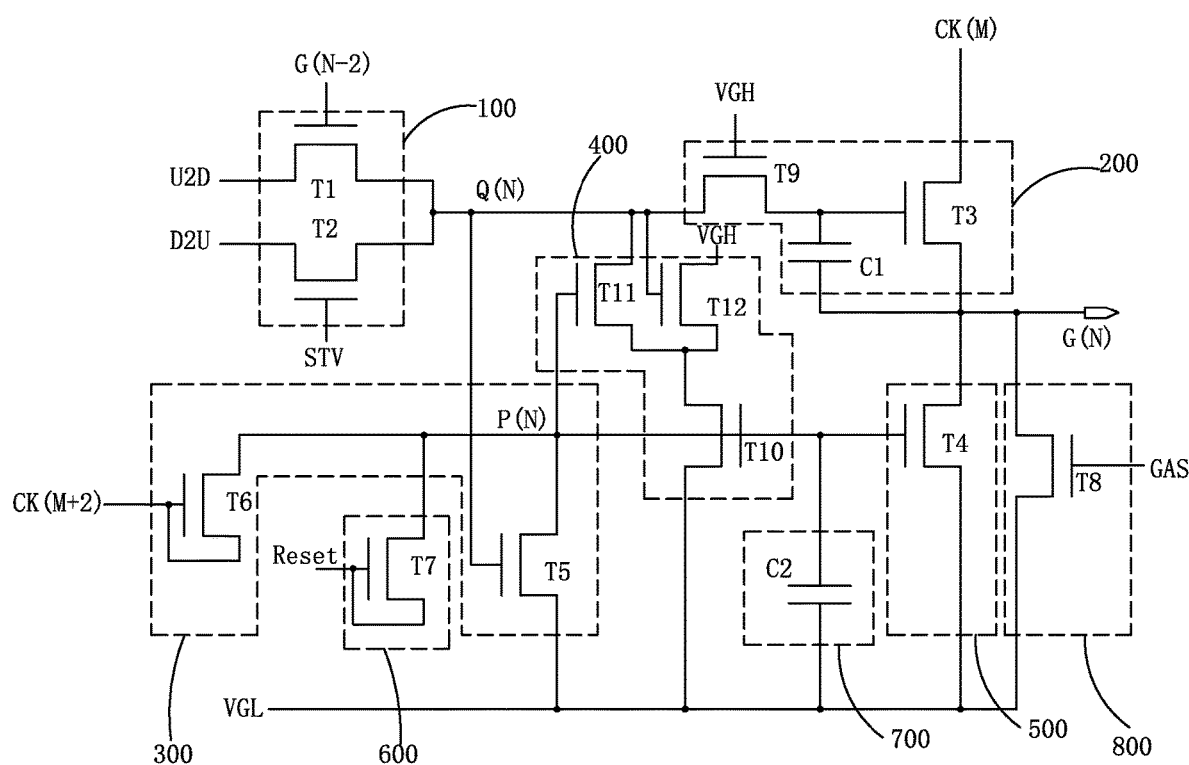
FIG. 3 is a schematic view showing the circuit of the last GOA unit and the second last GOA unit of the GOA circuit of the present invention.

Specifically, referring to FIG. 2, the first GOA unit and the second GOA unit have similar structure as the N-th GOA unit, and the difference is that: in the first GOA unit and second GOA unit, the gates of the first TFTs T1 are connected to the start signal STV. Referring to FIG. 3, the second last GOA unit and the last GOA unit have similar structure as the N-th GOA unit, and the difference is that: in the second last GOA unit and last GOA unit, the gates of the second TFTs T2 are connected to the start signal STV.

Specifically, in forward scanning, the forward scan control signal U2D is high and the backward scan control signal D2U is low; in backward scanning, the forward scan control signal U2D is low and the backward scan control signal D2U is high.

Figure 4:
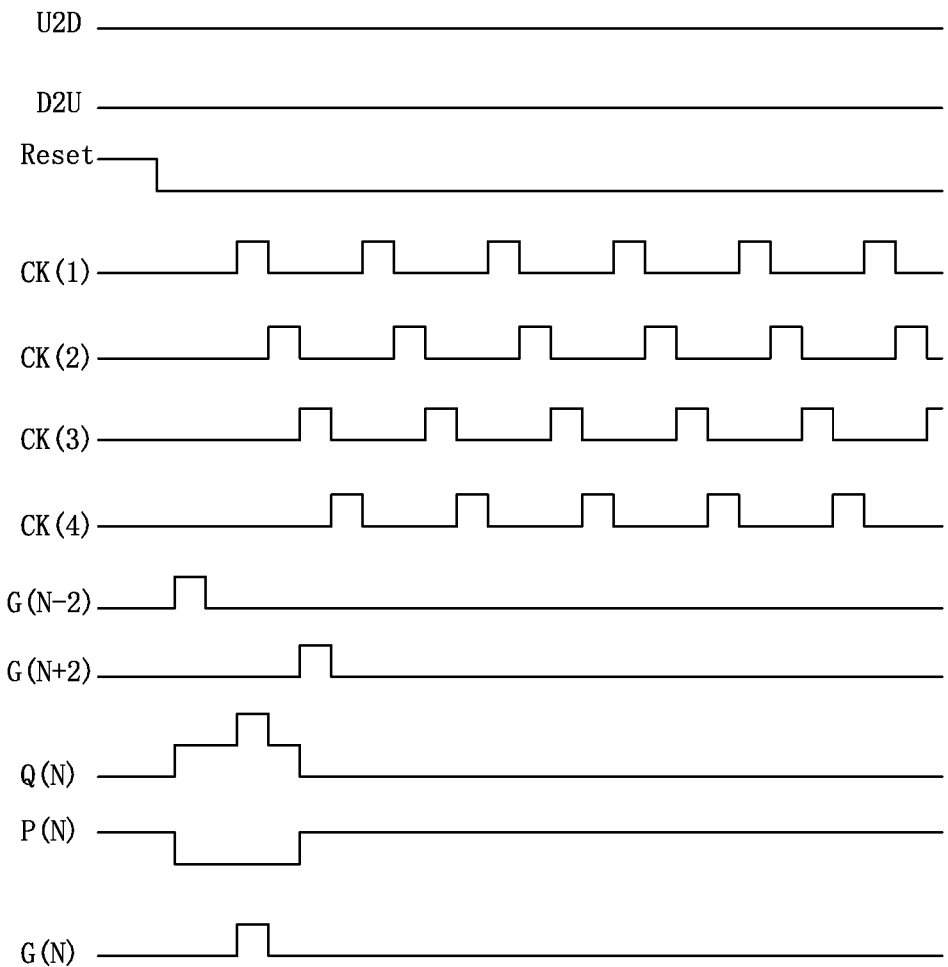
FIG. 4 is a schematic view showing the timing of the GOA circuit of the present invention in forward scanning.
Figure 5:
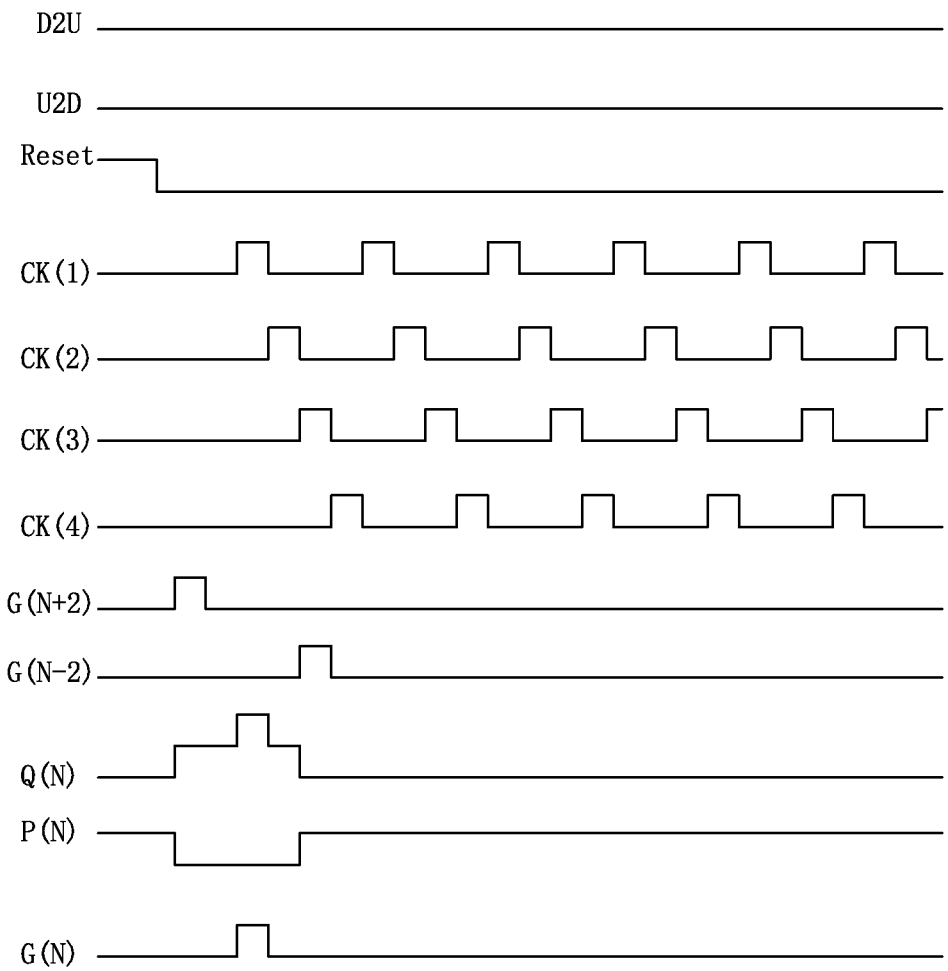
FIG. 5 is a schematic view showing the timing of the GOA circuit of the present invention in backward scanning.

Specifically, refer to FIG. 4 and FIG. 5. The GOA circuit comprises four clock signals: a first clock signal CK(1), a second clock signal CK(2), a third clock signal CK(3), and a fourth clock signal CK(4); when the M-th clock signal CK(M) is a third clock signal CK(3), the (M+2)th clock signal CK(M+2) is the first clock signal CK(1); when the M-th clock signal CK(M) is the fourth clock signal CK(4), the (M+2)th clock signal CK(M+2) is the second clock signal CK(2).

Moreover, the first clock signal CK(1), the second clock signal CK(2), the third clock signal CK(3), and the fourth clock signal CK(4) have the same pulse period, and a falling edge of the previous clock signal is generated simultaneously with a rising edge of the next clock signal.

Refer to FIG. 1 and FIG. 4. The forward scanning process of the N-th GOA unit of the GOA circuit of the present invention is as follows:

First, the reset signal Reset is high, the seventh TFT T7 is turned on, the high voltage is written to the second node P(N), the fourth TFT T4, the tenth TFT T10, and the eleventh TFT T11 are all turned on, and the first node Q(N) and the scan signals G(N) outputted from the drain of the third TFT T3 are both pulled down to the constant low voltage VGL. Thereafter, the scan signal G(N−2) of the (N−2)th GOA unit is high, and the high voltage of the forward scan control signal U2D is written to the first node Q(N) so that the first node Q(N) is high. The third TFT T3 and the fifth TFTT5 are both turned on, and the second node P(N) is at a low voltage. Then, the M-th clock signal CK(M) is high, and the scan signal G(N) outputted from the drain of the third TFT T3 is in the same phase as the M-th clock signal CK(M), and is at a high voltage. Then, the M-th clock signal CK(M) is at a low voltage, and the scan signal G(N) outputted from the drain of the third TFT T3 is in the same phase as the M-th clock signal CK(M), and is at a low voltage. Thereafter, the scan signal G(N+2) of the (N+2)th GOA unit is high, the second TFT T2 is turned on, and the first node Q(N) is written to a low voltage of the backward scan control signal D2U, and at the same time, the (M+2)-th clock signal CK(M+2) is high, the sixth TFT T6 is turned on, the high voltage is written to the second node P(N), the fourth TFT T4, and the tenth TFT T10 and the eleventh TFT T11 are all turned on, and the first node Q(N) and the scan signals G(N) outputted from the drain of the third TFT T3 are pulled down to the constant low voltage VGL and maintained at the constant low voltage VGL.

Refer to FIG. 1 and FIG. 5, the backward scanning process of the N-th GOA unit of the GOA circuit of the present invention is as follows:

First, the reset signal Reset is high, the seventh TFT T7 is turned on, the high voltage is written to the second node P(N), the fourth TFT T4, the tenth TFT T10, and the eleventh TFT T11 are all turned on, and the first node Q(N) and the scan signals G(N) outputted from the drain of the TFT T3 are both pulled down to the constant low voltage. Thereafter, the scan signal G(N+2) of the (N+2)th GOA unit is high, and the high voltage of the backward scan control signal D2U is written to the first node Q(N) so that the first node Q(N) is high. The third TFT T3 and the fifth TFTT5 are both turned on, and the second node P(N) is at a low voltage. Then, the M-th clock signal CK(M) is high, and the scan signal G(N) outputted from the drain of the third TFT T3 is in the same phase as the M-th clock signal CK(M), and is at a high voltage. Then, the M-th clock signal CK(M) is at a low voltage, and the scan signal G(N) outputted from the drain of the third TFT T3 is in the same phase as the M-th clock signal CK(M), and is at a low voltage. Thereafter, the scan signal G(N−2) of the (N−2)th GOA unit is high, the second TFT T2 is turned on, and the first node Q(N) is written to a low voltage of the forward scan control signal U2D, and at the same time, the (M+2)-th clock signal CK(M+2) is high, the sixth TFT T6 is turned on, the high voltage is written to the second node P(N), the fourth TFT T4, and the tenth TFT T10 and the eleventh TFT T11 are all turned on, and the first node Q(N) and the scan signals G(N) outputted from the drain of the third TFT T3 are pulled down to the constant low voltage VGL and maintained at the constant low voltage VGL.

It should be noted that in the GOA circuit of the present invention, when the first node Q(N) is at a high voltage, the voltage difference between the gate and source of the twelfth TFT T12 is the threshold voltage Vth thereof, that is, the difference between the high voltage of the first node Q (N) and the source voltage of the twelfth TFT T12 is the threshold voltage Vth of the twelfth TFT T12. The drain of the eleventh TFT T11 is electrically connected to the first node Q (N), the source is electrically connected to the source of the twelfth TFT T12 so that the drain-source voltage difference of the eleventh TFT T11 is also equal to the threshold voltage Vth of the twelfth TFT T12, thereby the resistance between the drain of the tenth TFT T10 and the first node Q(N) is extremely large, which is equivalent to a large resistance connected in series between the drain of the tenth TFT T10 and the first node Q(N). Therefore, even if noise and coupling occur at the second node P(N), the tenth TFT T10 does not generate leakage current. Thus, the high voltage of the first node Q(N) is not affected. Therefore, the present invention can ensure that the output of the scanning signal G(N) is normal, thereby solving the problem when the GOA circuit is applied to the display device, the scanning signal output capability after multiple cascaded propagation to cause problems, such as, split screen, to ensure the display performance of the display device.

In summary, the first node control module of the GOA circuit provided by the present invention comprises a tenth TFT, an eleventh TFT and a twelfth TFT of N-type TFTs, when the voltage of the first node is high, the gate-to-source voltage difference of the twelfth TFT is the threshold voltage thereof, so that the drain-source voltage difference of the eleventh TFT is also the threshold voltage of the twelfth TFT, thereby making the resistance between the drain of the tenth TFT and the first node is extremely large, which can avoid the impact of leakage current generated by the tenth TFT on the voltage of the first node when the noise and coupling in the second node occurs, and to ensure the normal output of the scan signal.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A gate driver on array (GOA) circuit, comprising: a plurality of cascaded GOA units, each GOA unit further comprising: a forward/backward scan control module, an output module, a second node control module, a first node control module, and an output terminal control module;

for positive integers N and M, N≥3, in the N-th GOA unit:

the forward/backward scan control module being configured to control a voltage of a first node according to a scan signal of the (N−2)th GOA unit, a scan signal of the (N+2)th GOA unit, a forward scan control signal, and a backward scan control signal;

the output module being configured to output a scan signal according to an M-th clock signal and the voltage of the first node;

the second node control module being configured to control a voltage of a second node according to an (M+2)th clock signal, the voltage of the first node, and a constant voltage low voltage;

the output terminal control module being configured to pull down the voltage of the scan signal according to the voltage of the second node and the constant low voltage;

the first node control module comprising a tenth thin film transistor (TFT), an eleventh TFT, and a twelfth TFT; the tenth TFT having a gate electrically connected to the second node, a source connected to the constant low voltage, a drain electrically connected to a source of the twelfth TFT; the eleventh TFT having a gate electrically connected to the second node, and a drain electrically connected to the first node, and a source electrically connected to the source of the twelfth TFT; the twelfth TFT having a gate electrically connected to the first node, and a drain connected to a constant high voltage; the tenth TFT, the eleventh TFT and the twelfth TFT being N-type TFTs.

2. The GOA circuit as claimed in claim 1, wherein the forward/backward scan control module comprises a first TFT and a second TFT, and the first TFT has a gate connected to the scan signal of the (N−2)th GOA unit, a source connected to the forward scan control signal, a drain electrically connected to the first node, and the second TFT has a gate connected to the scan signal of the (N+2)th GOA unit, a source connected to the backward scan control signal, and a drain electrically connected to the first node.

3. The GOA circuit as claimed in claim 2, wherein each GOA unit further comprises: a reset module, a bootstrap capacitor module, and a global control module; the reset module comprises a seventh TFT; and the seventh TFT has a gate and a source connected a reset signal, a drain electrically connected to the second node; the bootstrap capacitor module comprises a second capacitor, the second capacitor has one end electrically connected to the second node, and the other end connected to the constant low voltage; the global control module comprises an eighth TFT, the eighth TFT has a gate connected to a global control signal, a source connected to the constant low voltage, and a drain electrically connected to the drain of the third TFT.

4. The GOA circuit as claimed in claim 1, wherein the output module comprises a third TFT, a ninth TFT and a first capacitor; the ninth TFT has a gate connected to the constant high voltage, a source electrically connected to the first node and a drain electrically connected to a gate of the third TFT; the third TFT has a source connected to the M-th clock signal, and a drain outputting the scan signal; the first capacitor has two ends electrically connected respectively to the gate and the drain of the third TFT.

5. The GOA circuit as claimed in claim 1, wherein the second node control module comprises a fifth TFT and a sixth TFT; the fifth TFT has a gate electrically connected to the first node, a source connected to the constant low voltage, and a drain electrically connected to the second node; the sixth TFT has a gate and a source connected to the (M+2)th clock signal, and a drain electrically connected to the second node.

6. The GOA circuit as claimed in claim 1, wherein the output control module comprises a fourth TFT; the fourth TFT has a gate electrically connected to the second node, a source connected to the constant low voltage, and a drain electrically connected to the drain of the third TFT.

7. The GOA circuit as claimed in claim 1, wherein in forward scanning, the forward scan control signal is high and the backward scan control signal is low.

8. The GOA circuit as claimed in claim 1, wherein in backward scanning, the forward scan control signal is low and the backward scan control signal is high.

9. The GOA circuit as claimed in claim 1, wherein the GOA circuit comprises four clock signals: a first clock signal, a second clock signal, a third clock signal, and a fourth clock signal; when the M-th clock signal is a third clock signal, the (M+2)th clock signal is the first clock signal; when the M-th clock signal is the fourth clock signal, the (M+2)th clock signal is the second clock signal.

10. The GOA circuit as claimed in claim 9, wherein the first clock signal, the second clock signal, the third clock signal, and the fourth clock signal have the same pulse period, and a falling edge of the previous clock signal is generated simultaneously with a rising edge of the next clock signal.

* * * * *